United States Patent [19]

Uchiyama et al.

[11] Patent Number: 5,651,873
[45] Date of Patent: Jul. 29, 1997

[54] ELECTROPLATING SOLUTION FOR FORMING PB-SN ALLOY BUMP ELECTRODES ON SEMICONDUCTOR WAFER SURFACE

[75] Inventors: Naoki Uchiyama; Masayoshi Kohinata, both of Sanda; Akihiro Masuda, Ohmiya; Yoshiaki Okuhama, Kobe; Seishi Masaki, Kobe; Masakazu Yoshimoto, Kobe, all of Japan

[73] Assignees: Mitsubishi Materials Corporation, Tokyo; Daiwa Fine Chemicals Co., Ltd., Kobe, both of Japan

[21] Appl. No.: 494,957

[22] Filed: Jun. 26, 1995

[30] Foreign Application Priority Data

| | | | |
|---|---|---|---|
| Jun. 30, 1994 | [JP] | Japan | 6-171953 |
| Mar. 31, 1995 | [JP] | Japan | 7-100014 |
| Mar. 31, 1995 | [JP] | Japan | 7-100015 |

[51] Int. Cl.$^6$ .............. C25D 3/60; C25D 3/56; C25D 3/34; C25D 3/32
[52] U.S. Cl. .............. 205/253; 205/254; 205/259; 205/260; 205/299; 205/302; 205/304
[58] Field of Search ............. 205/238, 253, 205/254, 259, 260, 299, 302, 304; 106/1.24, 1.25, 1.28

[56] References Cited

U.S. PATENT DOCUMENTS

| | | | |
|---|---|---|---|
| 3,905,878 | 9/1975 | Dohi et al. | 205/254 |
| 4,459,185 | 7/1984 | Obata et al. | 205/302 |
| 4,582,576 | 4/1986 | Opaskar et al. | 106/1.25 |
| 4,885,064 | 12/1989 | Bokisa et al. | 205/252 |
| 5,021,130 | 6/1991 | Metzger et al. | 205/304 |
| 5,160,422 | 11/1992 | Nishimura et al. | 205/254 |

FOREIGN PATENT DOCUMENTS

| | | |
|---|---|---|
| 0 350 387 | 1/1990 | European Pat. Off. . |

OTHER PUBLICATIONS

Blanchard et al., *Chemical Abstracts*, 23928d, vol. 54 (no month, 1960).

*Primary Examiner*—Kathryn L. Gorgos
*Assistant Examiner*—Edna Wong
*Attorney, Agent, or Firm*—Frishauf, Holtz, Goodman, Langer & Chick, P.C.

[57] ABSTRACT

An electroplating solution (A), comprises an aqueous solution consisting essentially of lead phenolsulfonate: 1 to 250 g/liter in terms of Pb content; tin phenolsulfonate: 0.1 to 250 g/liter in terms of Sn content; phenolsulfonic acid: 20 to 300 g/liter; polyoxyethylene polyoxypropylene alkylamine: 1 to 50 g/liter; a 1-naphthaldehyde derivative: 0.001 to 1 g/liter; and an aldol sulfanilic acid derivative: 0.1 to 30 g/liter; or an aqueous solution (B) consisting essentially of lead methanesulfonate: 1 to 250 g/liter in terms of Pb content; tin methanesulfonate: 0.1 to 250 g/liter in terms of Sn content; methanesulfonic acid: 20 to 300 g/liter; polyoxyethylene polyoxypropylene alkylamine: 1 to 50 g/liter; and an aldol sulfanilic acid derivative: 0.1 to 30 g/liter. Each of the electroplating aqueous solutions (A) and (B) contains 50 ppb or less radioactive isotopes, whereby Pb-Sn alloy bump electrodes with improved uniformity in height and improved surface smoothness can be formed on a surface of a semiconductor wafer.

15 Claims, No Drawings

ELECTROPLATING SOLUTION FOR FORMING PB-SN ALLOY BUMP ELECTRODES ON SEMICONDUCTOR WAFER SURFACE

BACKGROUND OF THE INVENTION

1. Field of the Invention

This invention relates to an electroplating solution for forming Pb—Sn alloy bump electrodes on a surface of a semiconductor wafer, which each have a uniform height and a smooth surface, and contain 30 ppb or less radioactive isotopes mainly including U, Th, and/or decayed nuclides thereof (hereinafter referred to simply as "radioactive isotopes") such that radioactive α-particles radiated from the isotopes, which can cause soft error, can be reduced to 0.5 cph/cm$^2$ or less in terms of a count number thereof.

2. Prior Art

Conventionally, it is generally employed to form, by electroplating, bump electrodes of a Pb—Sn alloy (solder), each having a size of 20 to 250 μm in diameter and 20 to 100 μm in height on a surface of a semiconductor wafer, such as a Si wafer and a Ga—As wafer, in a number of 10,000 to 50,000 pieces per wafer, as described in "Microelectronics Packaging Handbook", pages 368 to 371, published by VAN NOSTRAND REINHOLD in 1989.

Pb—Sn alloy bump electrodes formed by the use of a conventional electroplating solution, however, are not satisfactory in that with recent increases in size of semiconductor wafers and degree of integration of circuits formed on the semiconductor wafers (packaging density), bump electrodes formed on a surface of a semiconductor wafer show variations in height therebetween, and degraded surface smoothness, exhibiting, in the worst case, a hedgehog-like surface or a rugged surface.

SUMMARY OF THE INVENTION

It is therefore the object of the invention to provide an electroplating solution which is capable of forming on a surface of a semiconductor wafer Pb—Sn alloy bump electrodes with improved uniformity in height and improved surface smoothness.

To attain the above object, the present invention provides an electroplating solution for forming Pb—Sn alloy bump electrodes on a surface of a semiconductor wafer, comprising an aqueous solution consisting essentially of:

lead phenolsulfonate: 1 to 250 g/liter in terms of Pb content;

tin phenolsulfonate: 0.1 to 250 g/liter in terms of Sn content;

phenolsulfonic acid: 20 to 300 g/liter;

polyoxyethylene polyoxypropylene alkylamine: 1 to 50 g/liter;

a 1-naphthaldehyde derivative: 0.001 to 1 g/liter; and an aldol sulfanilic acid derivative: 0.1 to 30 g/liter;

said aqueous solution containing 50 ppb or less radioactive isotopes mainly including U, Th, and/or decayed nuclides thereof.

Preferably, the aqueous solution consists essentially of:

lead phenolsulfonate: 5 to 100 g/liter in terms of Pb content;

tin phenolsulfonate: 0.2 to 100 g/liter in terms of Sn content;

phenolsulfonic acid: 50 to 150 g/liter;

polyoxyethylene polyoxypropylene alkylamine: 2 to 15 g/liter;

a 1-naphthaldehyde derivative: 0.005 to 0.3 g/liter; and an aldol sulfanilic acid derivative: 0.5 to 15 g/liter.

Alternatively, to attain the object, the present invention provides an electroplating solution for forming Pb—Sn alloy bump electrodes on a surface of a semiconductor wafer, comprising an aqueous solution consisting essentially of:

lead methanesulfonate: 1 to 250 g/liter in terms of Pb content;

tin methanesulfonate: 0.1 to 250 g/liter in terms of Sn content;

methanesulfonic acid: 20 to 300 g/liter;

polyoxyethylene polyoxypropylene alkylamine: 1 to 50 g/liter; and an aldol sulfanilic acid derivative: 0.1 to 30 g/liter;

said electroplating solution containing 50 ppb or less radioactive isotopes mainly including U, Th, and/or decayed nuclides thereof.

Preferably, the aqueous solution consists essentially of:

lead methanesulfonate: 5 to 100 g/liter in terms of Pb content;

tin methanesulfonate: 0.2 to 100 g/liter in terms of Sn content;

methanesulfonic acid: 50 to 150 g/liter;

polyoxyethylene polyoxypropylene alkylamine: 2 to 15 g/liter; and an aldol sulfanilic acid derivative: 0.5 to 15 g/liter.

The above and other objects, features and advantages of the invention will be more apparent from the ensuing detailed description

DETAILED DESCRIPTION

Under the aforementioned circumstances, the present inventors have made studies in order to obtain an electroplating solution capable of forming Pb—Sn alloy bump electrodes on a surface of a semiconductor wafer, with reduced variations in height and improved surface smoothness, and have reached the following finding:

If Pb—Sn alloy bump electrodes are formed by electroplating, on a surface of a semiconductor wafer, by using the following electroplating solution:

An aqueous solution (A) consisting essentially of:

lead phenolsulfonate (hereinafter referred to as "Pb-P.S."): 1 to 250 g/liter in terms of Pb content;

tin phenolsulfonate (hereinafter referred to as "Sn-P.S."): 0.1 to 250 g/liter in terms of Sn content;

phenolsulfonic acid (hereinafter referred to as "P.S."): 20 to 300 g/liter;

polyoxyethylene polyoxypropylene alkylamine (hereinafter referred to as "E.P.A."): 1 to 50 g/liter;

a 1-naphthaldehyde derivative (hereinafter referred to as "1N.D."): 0.001 to 1 g/liter; and an aldol sulfanilic acid derivative (hereinafter referred to as "A.S.D."): 0.1 to 30 g/liter, or An aqueous solution (B) consisting essentially of:

lead methanesulfonate (hereinafter referred to as "Pb-M.S."): 1 to 250 g/liter in terms of Pb content;

tin methanesulfonate (hereinafter referred to as "Sn-M.S."): 0.1 to 250 g/liter in terms of Sn content;

methanesulfonic acid (hereinafter referred to as "M.S."): 20 to 300 g/liter;

E.P.A.: 1 to 50 g/liter; and

A.S.D.: 0.1 to 30 g/liter, the thus formed bump electrodes show uniformity in height therebetween and each have a smooth surface even if the semiconductor wafer has a large diameter and is adapted to have circuit elements formed thereon with a high degree of integration. Further, it has been found that if the content of radioactive isotopes in the electroplating solution is limited to 50 ppb or less, the content of the radioactive isotopes in the bump electrodes is limited to 30 ppb or less, whereby the count number of radioactive α particles radiated from the isotopes is limited to 0.5 cph/cm² or less. As a result, in production of semiconductor devices, especially flip chip packages in which the influence of radioactive α particles present in the electrodes on the semiconductor wafer is conspicuous, employment of the above electroplating solution can contribute to reduction in soft error attributable to radioactive α particles.

The present invention is based upon the above findings.

The electroplating solution according to the invention has the aforestated chemical composition.

The contents of the components of the electroplating solution according to the invention have been limited as previously stated, for the following reasons:

(a) Pb-P.S. or Pb-M.S. and Sn-P.S. or Sn-M.S.

The composition of the Pb—Sn alloy bump electrodes formed on a surface of a semiconductor wafer is determined by the contents of these component elements. Generally, a Pb—Sn alloy of this kind contains 1 to 60 % by weight Sn, and the balance of Pb. Therefore, to be commensurate with the general composition of the Pb—Sn alloy, the content of Pb-P.S. or Pb-M.S. should be determined such that it is limited in terms of Pb content to a range of 1 to 250 g/liter, and preferably to a range of 5 to 100 g/liter, and the content of Sn-P.S. or Sn-M.S. should be determined such that it is limited in terms of Sn content to a range of 0.1 to 250 g/liter, and preferably to a range of 0.2 to 100 g/liter.

(b) P.S. or M.S.

P.S. or M.S. acts to promote dissolution of Pb-P.S. and Sn-P.S., or Pb-M.S. and Sn-M.S., into an aqueous solution, and to improve adhesion of the bump electrodes to the surface of the semiconductor wafer. However, if the P.S. or M.S. content is less than 20 g/liter, a desired degree of adhesion cannot be obtained. On the other hand, if the P.S. or M.S. content exceeds 300 g/liter, the plating rate can decrease. Therefore, the P.S. or M.S. content has been limited to a range of 20 to 300 g/liter, and preferably to a range of 50 to 150 g/liter.

(c) E.P.A. in Solution (A):

E.P.A. in the solution (A) acts to suppress a change in the composition of the bump electrodes during formation thereof, to thereby homogenize the composition of the bump electrodes. However, if the E.P.A. content is less than 1 g/liter, the above action cannot be achieved to a desired extent, whereas if the E.P.A. content exceeds 50 g/liter, the resulting bump electrodes have degraded surface smoothness. Therefore, the E.P.A. content has been limited to a range of 1 to 50 g/liter, and preferably to a range of 2 to 15 g/liter.

The composition of E.P.A. employed in the invention is represented by the following chemical formula (1):

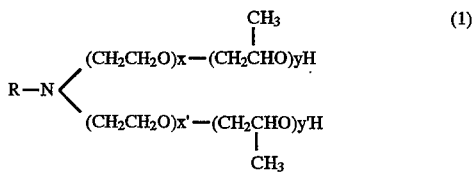

(1)

where R represents an alkyl group having 8 to 18 carbon atoms, x+x' an integer from 1 to 20, and y+y' an integer from 0 to 20.

(d) E.P.A. in Solution (B):

E.P.A. in the solution (B) acts to suppress a change in the composition of the bump electrodes during formation thereof and to equalize the plating rate over the whole surface of the semiconductor wafer, to thereby greatly reduce variations in height between the bump electrodes formed. However, if the E.P.A. content is less than 1 g/liter, the above actions cannot be achieved to a desired extent, whereas if the E.P.A. content exceeds 50 g/liter, the plating rate sharply decreases. Therefore, the E.P.A. content has been limited to a range of 1 to 50 g/liter. Preferably the E.P.A. content should be limited to 2 to 15 g/liter.

The composition of E.P.A. employed in the invention is also represented by the same chemical formula as the above given chemical formula (1).

(e) 1N.D. in Solution (A):

1N.D. acts to equalize the plating rate over the whole semiconductor surface to achieve formation of a plating layer having a uniform thickness over the whole semiconductor wafer surface, whereby variations in height between the bump electrodes are greatly reduced. However, if the 1N.D. content is less than 0.001 g/liter, the above action cannot be performed to a desired extent, whereas if the 1N.D. content exceeds 1 g/liter, the formed bump electrodes include deformed ones. Therefore, the 1N.D. content has been limited to a range of 0.001 to 1 g/liter, and preferably to a range of 0.005 to 0.3 g/liter.

The composition of 1N.D. employed in the invention is represented by the following chemical formula (2):

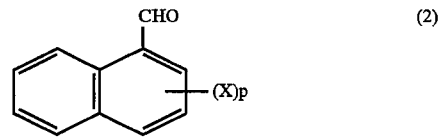

(2)

where X represents hydrogen, a hydroxyl group, an alkyl group, an aryl group, an alkylaryl group, a carboxyl group, or a sulfonic group, and p an integer from 0 to 3.

(f) A.S.D.

A.S.D. acts to make the shape of the bump electrodes uniform and smooth the surfaces thereof. However, if the A.S.D. content is less than 0.1 g/liter, the above actions cannot be performed to a desired extent. On the other hand, if the A.S.D. content exceeds 30 g/liter, the plating rate decreases. Therefore, the A.S.D. content has been limited to a range of 0.1 to 30 g/liter. Preferably, the A.S.D. content should be limited to a range of 0.5 to 15 g/liter.

The composition of A.S.D. employed in the solutions (A) and (B) is represented by the following chemical formula (3):

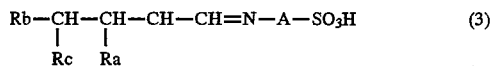

(3)

where Rb represents hydrogen, an alkyl group having 1 to 4 carbon atoms, or a phenyl group, Ra is hydrogen, or an alkyl group having 1 to 4 carbon atoms, Rc hydrogen, or a hydroxyl group, and A a phenylene group.

Mixing of radioactive isotopes into the electroplating solution according to the invention is caused by Pb and Sn metals which are used as starting materials for preparing Pb-P.S. or Pb-M.S. and Sn-P.S. or Sn-M.S. Therefore, by decreasing the content of radioactive isotopes in the Pb and Sn metals, the content of the radioactive isotopes in the electroplating solution can be reduced to 50 ppb or less, and hence to reduction in the content of the radioactive isotopes in the resulting bump electrodes to 30 ppb or less. As a result, the count number of radioactive α particles radiated from the isotopes can be 0.5 cph/cm² or less, which can greatly contribute to reduction in soft error attributable to radioactive α particles.

Next, examples of the electroplating solution according to the invention will be described hereinbelow.

EXAMPLE 1

As starting materials, there were prepared Pb-P.S. and Sn-P.S., each containing 50 ppb radioactive isotopes, E.P.A. represented by the chemical formula (1), wherein R is equal to an alkyl group having 12 carbon atoms, x+x' to 10, and y+y' to 3, 1N.D. represented by the chemical formula (2), wherein X is equal to an alkyl group, and p to 1, and A.S.D. represented by the chemical formula (3), wherein Ra and Rb are each equal to an alkyl group having two carbon atoms, and Rc to a hydroxyl group. These starting materials were dissolved into aqueous solutions in proportions shown in Tables 1 and 2. Thus, electroplating solutions Nos. 1 to 16 according to the present invention and comparative electroplating solutions Nos. 1 to 10, each containing 50 ppb or less radioactive isotopes, were prepared.

The comparative electroplating solutions Nos. 1 to 10 each fall outside the range of the present invention in the content of one of the components which causes an undesirable effect on the height and/or surface state of the bump electrodes, as asterisked in Table 2.

TABLE 1

| SPECIMENS | | CHEMICAL COMPOSITION (g/l) | | | | | |
|---|---|---|---|---|---|---|---|
| | | Pb-P.S. (Pb CONTENT) | Sn-P.S. (Sn CONTENT) | P.S. | E.P.A. | 1N.D. | A.S.D. |
| ELECTROPLATING | 1 | 19 | 1 | 50 | 5 | 0.01 | 5 |
| SOLUTIONS OF | 2 | 38 | 2 | 100 | 6 | 0.05 | 7 |
| PRESENT | 3 | 57 | 3 | 100 | 8 | 0.1 | 10 |
| INVENTION | 4 | 237.5 | 12.5 | 250 | 20 | 0.5 | 20 |
| | 5 | 160 | 240 | 150 | 30 | 0.5 | 20 |
| | 6 | 19 | 1 | 20 | 5 | 0.05 | 5 |
| | 7 | 19 | 1 | 300 | 5 | 0.05 | 5 |
| | 8 | 19 | 1 | 100 | 1 | 0.05 | 1 |
| | 9 | 19 | 1 | 100 | 50 | 0.05 | 1 |
| | 10 | 38 | 2 | 100 | 6 | 0.001 | 5 |
| | 11 | 38 | 2 | 100 | 6 | 1 | 5 |
| | 12 | 38 | 2 | 100 | 6 | 0.05 | 0.1 |
| | 13 | 38 | 2 | 100 | 6 | 0.05 | 30 |
| | 14 | 2.4 | 0.6 | 70 | 5 | 0.05 | 6 |
| | 15 | 100 | 150 | 70 | 10 | 0.3 | 15 |
| | 16 | 120 | 80 | 100 | 10 | 0.3 | 15 |

TABLE 2

| SPECIMENS | | CHEMICAL COMPOSITION (g/l) | | | | | |
|---|---|---|---|---|---|---|---|
| | | Pb-P.S. (Pb CONTENT) | Sn-P.S. (Sn CONTENT) | P.S. | E.P.A. | 1N.D. | A.S.D. |
| COMPARATIVE | 1 | 19 | 1 | 100 | 80* | 0.05 | 8 |
| ELECTROPLATING | 2 | 19 | 1 | 100 | 5 | —* | 8 |
| SOLUTIONS | 3 | 19 | 1 | 10 | 5 | 2* | 8 |
| | 4 | 19 | 1 | 80 | 5 | 0.05 | 0.005* |
| | 5 | 19 | 1 | 50 | 5 | 0.05 | 40* |
| | 6 | 38 | 2 | 100 | 60* | 0.05 | 5 |
| | 7 | 38 | 2 | 100 | 5 | —* | 5 |
| | 8 | 38 | 2 | 100 | 5 | 1.5* | 5 |
| | 9 | 38 | 2 | 80 | 5 | 0.05 | 0.005* |
| | 10 | 38 | 2 | 50 | 5 | 0.05 | 50* |

NOTE: The asterisked value falls outside the range according to the present invention.

EXAMPLE 2

As starting materials, there were prepared Pb-M.S. and Sn-M.S., each containing 50 ppb radioactive isotopes, E.P.A. represented by the chemical formula (1), wherein R is equal to an alkyl group having 10 carbon atoms, x+x' to 8, and y+y' to 3, and A.S.D. represented by the chemical formula (3), wherein Ra and Rb are each equal to an alkyl group having 2 carbon atoms, and Rc to a hydroxyl group. These starting materials were dissolved into aqueous solutions in proportions shown in Table 3. Thus, electroplating solutions Nos. 17 to 30 according to the present invention and comparative electroplating solutions Nos. 11 to 14, each containing 50 ppb or less radioactive isotopes, were prepared.

The comparative electroplating solutions Nos. 11 to 14 each fall below the range of the present invention in the content of one of the components which causes an undesirable effect on the height and/or surface state of the bump electrodes, as asterisked in Table 3.

TABLE 3

| SPECIMENS | | Pb-M.S. (Pb CONTENT) | Sn-M.S. (Sn CONTENT) | M.S. | E.P.A. | A.S.D. |
|---|---|---|---|---|---|---|
| ELECTROPLATING | 17 | 19 | 1 | 70 | 5 | 5 |
| SOLUTIONS | 18 | 38 | 2 | 70 | 6 | 7 |
| OF PRESENT | 19 | 57 | 3 | 70 | 8 | 10 |
| INVENTION | 20 | 237.5 | 12.5 | 200 | 20 | 20 |
|  | 21 | 160 | 240 | 250 | 30 | 20 |
|  | 22 | 19 | 1 | 20 | 5 | 5 |
|  | 23 | 19 | 1 | 300 | 5 | 5 |
|  | 24 | 19 | 1 | 100 | 1 | 1 |
|  | 25 | 19 | 1 | 70 | 50 | 1 |
|  | 26 | 38 | 2 | 70 | 6 | 0.1 |
|  | 27 | 38 | 2 | 70 | 6 | 30 |
|  | 28 | 2.4 | 0.6 | 50 | 5 | 6 |
|  | 29 | 100 | 150 | 50 | 10 | 15 |
|  | 30 | 120 | 80 | 150 | 10 | 15 |
| COMPARATIVE | 11 | 19 | 1 | 70 | 0.5* | 8 |
| ELECTROPLATING | 12 | 19 | 1 | 70 | 5 | 0.01* |
| SOLUTIONS | 13 | 38 | 2 | 70 | 0.5* | 8 |
|  | 14 | 38 | 2 | 70 | 5 | 0.01* |

NOTE: The asterisked value falls outside the range according to the present invention.

Next, Si wafers each having a diameter of 4 inches (approximately 10 cm) were prepared by forming a resist film having a thickness of 10 μm on a copper substrate electrode having a thickness of 2 μm, and then subjecting the thus formed resist film to photo-etching to form 50,000 fine holes each having a diameter of 50 μm and regularly arranged at equal intervals.

Further, a jet type plating device was prepared by horizontally arranging a Pt-plated pure Ti mesh having a diameter of 10 cm as an anode, in a plating tank having an inner diameter of 10 cm at a lower portion thereof.

Each of the above prepared Si wafers was mounted like a lid on the top surface of the plating tank of the above-mentioned plating device, with the plating surface facing downward to serve as a cathode. Each of the above prepared plating solutions was charged into the plating tank. Then, electroplating was conducted by causing the electroplating solution to be upwardly jetted and circulated from a lower portion of the plating tank, under the following conditions:

Cathodic current density: 2A/dm$^2$,

Jet rate: 6 liter/min,

Voltage applied: 3 V,

Temperature of the plating solution: 20° C., and

Plating time: 25 min.

Thus, Pb—Sn alloy bump electrodes having a desired height of 30 μm were formed on the plating surface of the Si wafer.

Further, a Pb—Sn alloy flat plating film for measuring the count number of radioactive particles was prepared by soaking a copper sheet into a large-sized beaker charged with each of the electroplating solutions shown in Tables 1 to 3, and conducting electroplating under the following conditions:

Cathodic current density: 2A/dm$^2$,

Temperature of the plating solution: 20° C., and

Cathode moving rate: 2 m/min.

Then, the thus formed Pb—Sn alloy bump electrodes on the surface of the Si wafer were measured in respect of the height by arbitrarily selecting 100 electrodes arranged along two diametrical segments crossing each other at right angles on the Si wafer surface, and measuring heights of the selected electrodes by using an optical microscope with a height gauge. Then, the maximum and minimum height values were picked up from the measured values, and a mean value thereof was calculated. Further, the surface states of the electrodes were observed, to thereby measure the ratio of bump electrodes having smooth surfaces to the 100 electrodes. Results of the measurements and calculation are shown in Tables 4 to 7.

Besides, the Sn content and the content of radioactive isotopes (the total quantitative analytic value of U and Th) of the bump electrodes as well as the count number of radioactive α particles measured by the use of the flat plating film are shown in Tables 4 to 7.

TABLE 4

| SPECIMENS | | Sn CONTENT (wt %) | ISOTOPE CONTENT (ppb) | BUMP ELECTRODES | | | RATIO OF BUMP ELECTRODES WITH SMOOTH SURFACE | COUNT NO. OF α PARTICLES ON PLATED SURFACE (cph/cm$^2$) |
|---|---|---|---|---|---|---|---|---|
|  |  |  |  | HEIGHT (μm) | | | | |
|  |  |  |  | MAXI-MUM VALUE | MINI-MUM VALUE | MEAN VALUE | | |
| ELECTROPLATING | 1 | 4.5 | 25 | 35 | 29 | 33 | 100/100 | 0.44 |
| SOLUTIONS | 2 | 5.2 | 9 | 40 | 28 | 33 | 100/100 | 0.13 |
| OF PRESENT | 3 | 5.1 | 8 | 40 | 30 | 36 | 88/100 | 0.11 |
| INVENTION | 4 | 4.8 | 12 | 32 | 24 | 29 | 100/100 | 0.21 |

TABLE 4-continued

| SPECIMENS | | Sn CONTENT (wt %) | ISOTOPE CONTENT (ppb) | BUMP ELECTRODES | | | | COUNT NO. OF α PARTICLES ON PLATED SURFACE (cph/cm²) |
|---|---|---|---|---|---|---|---|---|
| | | | | HEIGHT (μm) | | | RATIO OF BUMP ELECTRODES WITH SMOOTH SURFACE | |
| | | | | MAXIMUM VALUE | MINIMUM VALUE | MEAN VALUE | | |
| | 5 | 58.4 | 5 | 36 | 28 | 30 | 100/100 | 0.09 |
| | 6 | 6.4 | 7 | 35 | 31 | 33 | 92/100 | 0.09 |
| | 7 | 4.3 | 15 | 30 | 25 | 27 | 100/100 | 0.26 |
| | 8 | 4.2 | 3 | 34 | 28 | 31 | 87/100 | 0.07 |
| | 9 | 6.0 | 3 | 31 | 23 | 29 | 89/100 | 0.08 |
| | 10 | 5.1 | 5 | 39 | 31 | 34 | 100/100 | 0.08 |
| | 11 | 4.8 | 8 | 38 | 33 | 35 | 89/100 | 0.12 |
| | 12 | 4.7 | 10 | 36 | 29 | 33 | 91/100 | 0.18 |
| | 13 | 4.4 | 23 | 32 | 28 | 29 | 90/100 | 0.31 |

TABLE 5

| SPECIMENS | | Sn CONTENT (wt %) | ISOTOPE CONTENT (ppb) | BUMP ELECTRODES | | | | COUNT NO. OF α PARTICLES ON PLATED SURFACE (cph/cm²) |
|---|---|---|---|---|---|---|---|---|
| | | | | HEIGHT (μm) | | | RATIO OF BUMP ELECTRODES WITH SMOOTH SURFACE | |
| | | | | MAXIMUM VALUE | MINIMUM VALUE | MEAN VALUE | | |
| ELECTROPLATING SOLUTIONS OF PRESENT INVENTION | 14 | 25.8 | 1 | 35 | 30 | 32 | 95/100 | 0.05 |
| | 15 | 62.3 | 2 | 36 | 31 | 34 | 93/100 | 0.06 |
| | 16 | 39.8 | 2 | 35 | 31 | 33 | 100/100 | 0.07 |
| COMPARATIVE ELECTROPLATING SOLUTIONS | 1 | 5.4 | 11 | 29 | 20 | 22 | 0/100 | 0.15 |
| | 2 | 3.4 | 5 | 48 | 11 | 32 | 55/100 | 0.08 |
| | 3 | 5.3 | 26 | 38 | 25 | 28 | 0/100 | 0.45 |
| | 4 | 4.8 | 8 | 28 | 15 | 24 | 0/100 | 0.11 |
| | 5 | 4.6 | 16 | 19 | 14 | 17 | 0/100 | 0.21 |
| | 6 | 5.3 | 6 | 32 | 23 | 25 | 0/100 | 0.08 |
| | 7 | 6.0 | 14 | 33 | 15 | 19 | 62/100 | 0.21 |
| | 8 | 4.2 | 5 | 37 | 20 | 24 | 18/100 | 0.07 |
| | 9 | 5.5 | 5 | 35 | 20 | 27 | 0/100 | 0.08 |
| | 10 | 6.1 | 9 | 14 | 11 | 12 | 40/100 | 0.14 |

TABLE 6

| SPECIMENS | | Sn CONTENT (wt %) | ISOTOPE CONTENT (ppb) | BUMP ELECTRODES | | | | COUNT NO. OF α PARTICLES ON PLATED SURFACE (cph/cm²) |
|---|---|---|---|---|---|---|---|---|
| | | | | HEIGHT (μm) | | | RATIO OF BUMP ELECTRODES WITH SMOOTH SURFACE | |
| | | | | MAXIMUM VALUE | MINIMUM VALUE | MEAN VALUE | | |
| ELECTROPLATING SOLUTIONS OF PRESENT INVENTION | 17 | 5.4 | 7 | 36 | 30 | 33 | 100/100 | 0.09 |
| | 18 | 4.9 | 15 | 39 | 32 | 36 | 100/100 | 0.24 |
| | 19 | 6.2 | 6 | 41 | 35 | 38 | 100/100 | 0.08 |
| | 20 | 5.5 | 6 | 33 | 28 | 31 | 98/100 | 0.08 |
| | 21 | 63.1 | 3 | 34 | 27 | 30 | 100/100 | 0.07 |
| | 22 | 4.6 | 1 | 35 | 28 | 31 | 100/100 | 0.05 |
| | 23 | 5.1 | 3 | 30 | 26 | 28 | 100/100 | 0.06 |
| | 24 | 5.3 | 18 | 36 | 31 | 34 | 99/100 | 0.30 |
| | 25 | 6.0 | 27 | 28 | 25 | 27 | 100/100 | 0.45 |
| | 26 | 5.5 | 8 | 37 | 30 | 35 | 98/100 | 0.12 |
| | 27 | 4.7 | 6 | 29 | 26 | 27 | 100/100 | 0.09 |
| | 28 | 20.6 | 10 | 38 | 34 | 36 | 100/100 | 0.15 |
| | 29 | 61.3 | 4 | 35 | 30 | 33 | 100/100 | 0.08 |
| | 30 | 40.5 | 2 | 40 | 33 | 37 | 95/100 | 0.05 |

TABLE 7

| SPECIMENS | | Sn CONTENT (wt %) | ISOTOPE CONTENT (ppb) | BUMP ELECTRODES | | | | COUNT NO. OF α PARTICLES ON PLATED SURFACE (cph/cm²) |
| --- | --- | --- | --- | --- | --- | --- | --- | --- |
| | | | | HEIGHT (μm) | | | RATIO OF BUMP ELECTRODES WITH SMOOTH SURFACE | |
| | | | | MAXI-MUM VALUE | MINI-MUM VALUE | MEAN VALUE | | |
| COMPARATIVE | 11 | 3.1 | 11 | 45 | 19 | 38 | 54/100 | 0.11 |
| ELECTROPLATING | 12 | 5.0 | 6 | 38 | 30 | 34 | 0/100 | 0.08 |
| SOLUTIONS | 13 | 4.1 | 26 | 39 | 18 | 25 | 42/100 | 0.45 |
| | 14 | 4.8 | 9 | 35 | 29 | 33 | 0/100 | 0.13 |

As is clear from the results of Tables 1 to 7, when any of the electroplating solutions Nos. 1 to 30 according to the present invention is employed to form Pb—Sn alloy bump electrodes on a surface of an Si wafer having a large diameter, the resulting bump electrodes contain only 30 ppb or less radioactive isotopes and accordingly have the count number of radioactive α particles as small as 0.5 cph/cm² or less. Further, according to the present invention, the bump electrodes can be formed densely on the Si wafer surface, showing very small variations in height, and most or all of the bump electrodes exhibit satisfactorily smooth surfaces. On the other hand, as is learned from the comparative electroplating solutions Nos. 1 to 14, if one of the components falls outside the range of the present invention, the resulting bump electrodes show inferiority in at least one of the above properties.

As described hereinabove, according to the electroplating solution of the invention, Pb—Sn alloy bump electrodes can be formed by electroplating on a surface of a semiconductor wafer, which have very small variations in height as well as high surface smoothness and contain only 30 ppb or less radioactive isotopes, even if the semiconductor wafer has a large diameter and is to have a high degree of integration. Therefore, the thus formed bump electrodes according to the invention can bring about industrially advantageous results in the art, such as reduction in soft error.

What is claimed is:

1. An electroplating solution for forming Pb—Sn alloy bump electrodes on a surface of a semiconductor water, said electroplating solution being an aqueous solution consisting essentially of:

lead phenolsulfonate: 1 to 250 g/liter in terms of Pb content;

tin phenolsulfonate: 0.1 to 250 g/liter in terms of Sn content;

a phenolsulfonic acid: 20 to 300 g/liter;

polyoxyethylene polyoxypropylene alkylamine: 1 to 50 g/liter;

a 1-naphthaldehyde compound: 0.001 to 1 g/liter; and an aldol sulfanilic acid compound: 0.1 to 30 g/liter;

said aqueous electroplating solution containing radioactive isotopes selected from the group consisting of U, Th, and decayed nuclides thereof, in an amount not exceeding 50 ppb.

2. The electroplating solution as claimed in claim 1, wherein said aqueous solution consists essentially of:

lead phenolsulfonate: 5 to 100 g/liter in terms of Pb content;

tin phenolsulfonate: 0.2 to 100 g/liter in terms of Sn content;

phenolsulfonic acid: 50 to 150 g/liter;

polyoxyethylene polyoxypropylene alkylamine: 2 to 15 g/liter;

1-naphthaldehyde compound: 0.005 to 0.3 g/liter; and aldol sulfanilic acid derivative: 0.5 to 15 g/liter.

3. The electroplating solution as claimed in claim 1, wherein the polyoxyethylene polyoxypropylene alkylamine is of the formula

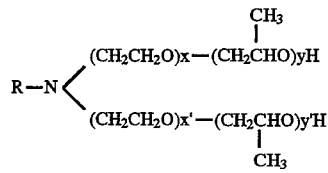

where R is a $C_8$–$C_{18}$ alkyl group, x+x' is 1 to 20 and y+y' is 0 to 20.

4. The electroplating solution as claimed in claim 1, wherein the 1-naphthaldehyde compound is of the formula

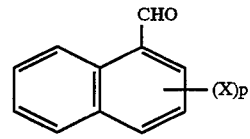

where X is hydrogen, a hydroxyl group, an alkyl group, an aryl group, an alkylaryl group, a carboxyl group or a sulfonic group and p is 0 to 3.

5. The electroplating solution as claimed in claim 1, wherein the aldol sulfanilic acid compound is of the formula

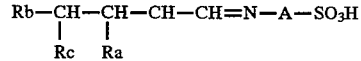

where Rb is hydrogen, a $C_1$–$C_4$ alkyl group or a phenyl group,

Ra is hydrogen or a $C_1$–$C_4$ alkyl group,

Rc is hydrogen or a hydroxyl group and

A is a phenylene group.

6. The electroplating solution as claimed in claim 1, wherein the polyoxyethylene polyoxypropylene alkylamine is of the formula

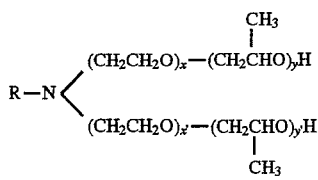

where R is a $C_8$-$C_{18}$ alkyl group, x+x' is 1 to 20 and y+y' is 0 to 20;

the 1-naphthaldehyde compound is of the formula

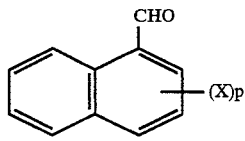

where X is hydrogen, a hydroxyl group, an alkyl group, an aryl group, an alkylaryl group, a carboxyl group or a sulfonic group and p is 0 to 3; and the aldol sulfanilic acid compound is of the formula

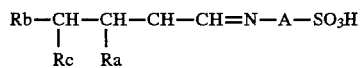

where Rb is hydrogen, a $C_1$-$C_4$ alkyl group or a phenyl group,

Ra is hydrogen or a $C_1$-$C_4$ alkyl group,

Rc is hydrogen or a hydroxyl group and

A is a phenylene group.

7. The electroplating solution as claimed in claim 6, wherein R is a $C_{12}$ alkyl group, x+x' is 10, y=y' is 3, X is an alkyl group, p is 1, Ra is a $C_2$ alkyl group, Rb is a $C_2$ alkyl group and Rc is a hydroxyl group.

8. The electroplating solution as claimed in claim 6, wherein said electroplating solution has a composition which is selected from the group consisting of (a) 19 g/l lead phenolsulfate, 1 g/l tin phenolsulfate, 50 g/l phenolsulfonic acid, 5 g/l polyoxyethylene polyoxypropylene alkylamine, 0.01 g/l naphthaldehyde compound and 5 g/l at the aldol sulfanilic acid compound;

(b) 38 g/l lead phenolsulfate, 2 g/l tin phenolsulfate, 100 g/l phenolsulfonic acid, 6 g/l polyoxyethylene polyoxypropylene alkylamine, 0.05 g/l naphthaldehyde compound and 7 g/l of the aldol sulfanilic acid compound;

(c) 57 g/l lead phenolsulfate, 3 g/l tin phenolsulfate, 100 g/l phenolsulfonic acid, 8 g/l polyoxyethylene polyoxypropylene alkylamine, 0.01 g/l naphthaldehyde compound and 10 g/l at the aldol sulfanilic acid compound;

(d) 237.5 g/l lead phenolsulfate, 12.5 g/l tin phenolsulfate, 250 g/l phenolsulfonic acid, 20 g/l polyoxyethylene polyoxypropylene alkylamine, 0.5 g/l naphthaldehyde compound and 20 g/l at the aldol sulfanilic acid compound;

(e) 160 g/l lead phenolsulfate, 240 g/l tin phenolsulfate, 150 g/l phenolsulfonic acid, 30 g/l polyoxyethylene polyoxypropylene alkylamine, 0.5 g/l naphthaldehyde compound and 20 g/l at the aldol sulfanilic acid compound;

(f) 19 g/l lead phenolsulfate, 1 g/l tin phenolsulfate, 20 g/l phenolsulfonic acid, 5 g/l polyoxyethylene polyoxypropylene alkylamine, 0.05 g/l naphthaldehyde compound and 5 g/l at the aldol sulfanilic acid compound;

(g) 19 g/l lead phenolsulfate, 1 g/l tin phenolsulfate, 300 g/l phenolsulfonic acid, 5 g/l polyoxyethylene polyoxypropylene alkylamine, 0.05 g/l naphthaldehyde compound and 5 g/l at the aldol sulfanilic acid compound;

(h) 19 g/l lead phenolsulfate, 1 g/l tin phenolsulfate, 100 g/l phenolsulfonic acid, 1 g/l polyoxyethylene polyoxypropylene alkylamine, 0.05 g/l naphthaldehyde compound and 1 g/l at the aldol sulfanilic acid compound;

(i) 19 g/l lead phenolsulfate, 1 g/l tin phenolsulfate, 100 g/l phenolsulfonic acid, 50 g/l polyoxyethylene polyoxypropylene alkylamine, 0.05 g/l naphthaldehyde compound and 1 g/l at the aldol sulfanilic acid compound;

(j) 38 g/l lead phenolsulfate, 2 g/l tin phenolsulfate, 100 g/l phenolsulfonic acid, 6 g/l polyoxyethylene polyoxypropylene alkylamine, 0.001 g/l naphthaldehyde compound and 5 g/l at the aldol sulfanilic acid compound;

(k) 38 g/l lead phenolsulfate, 2 g/l tin phenolsulfate, 100 g/l phenolsulfonlc acid, 6 g/l polyoxyethylene polyoxypropylene alkylamine, 1 g/l naphthaldehyde compound and 5 g/l at the aldol sulfanilic acid compound;

(l) 38 g/l lead phenolsulfate, 2 g/l tin phenolsulfate, 100 g/l phenolsulfonic acid, 6 g/l polyoxyethylene polyoxypropylene alkylamine, 0.05 g/l naphthaldehyde compound and 0.1 g/l at the aldol sulfanilic acid compound;

(m) 38 g/l lead phenolsulfate, 2 g/l tin phenolsulfate, 100 g/l phenolsulfonic acid, 6 g/l polyoxyethylene polyoxypropylene alkylamine, 0.05 g/l naphthaldehyde compound and 30 g/l at the aldol sulfanilic acid compound;

(n) 2.4 g/l lead phenolsulfate, 0.6 g/l tin phenolsulfate, 70 g/l phenolsulfonic acid, 5 g/l polyoxyethylene polyoxypropylene alkylamine, 0.05 g/l naphthaldehyde compound and 6 g/l at the aldol sulfanilic acid compound;

(o) 100 g/l lead phenolsulfate, 150 g/l tin phenolsulfate, 70 g/l phenolsulfonic acid, 10 g/l polyoxyethylene polyoxypropylene alkylamine, 0.3 g/l naphthaldehyde compound and 15 g/l at the aldol sulfanilic acid compound; and (p) 120 g/l lead phenolsulfate, 80 g/l tin phenolsulfate, 100 g/l phenolsulfonic acid, 10 g/l polyoxyethylene polyoxypropylene alkylamine, 0.3 g/l naphthaldehyde compound and 15 g/l at the aldol sulfanilic acid compound.

9. An electroplating solution for forming Pb—Sn alloy bump electrodes on a surface of a semiconductor water, said solution being an solution consisting essentially of:

lead methanesulfonate: 1 to 250 g/liter in terms of Pb content;

tin methanesulfonate: 0.1 to 250 g/liter in terms of Sn content;

methanesulfonic acid: 20 to 300 g/liter;

a polyoxyethylene polyoxypropylene alkylamine: 1 to 50 g/liter; and an aldol sulfanilic acid compound: 0.1 to 30 g/liter;

said aqueous electroplating solution containing radioactive isotopes selected from the group consisting of U, Th, and decayed nuclides thereof, in an amount not exceeding 50 ppb.

10. The electroplating solution as claimed in claim 9, wherein said aqueous solution consists essentially of:

lead methanesulfonate: 5 to 100 g/liter in terms of Pb content;

tin methanesulfonate: 0.2 to 100 g/liter in terms of Sn content;

methanesulfonic acid: 50 to 150 g/liter;

polyoxyethylene polyoxypropylene alkylamine: 2 to 15 g/liter; and aldol sulfanilic acid compound: 0.5 to 15 g/liter.

11. The electroplating solution as claimed in claim 9, wherein the polyoxyethylene polypropylene alkylamine is of the formula

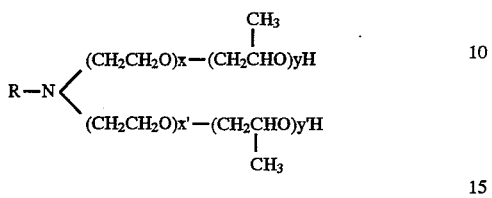

where R is a $C_8$–$C_{18}$ alkyl group, x+x' is 1 to 20 and y+y' is 0 to 20.

12. The electroplating solution as claimed in claim 1, wherein the aldol sulfanilic acid compound is of the formula

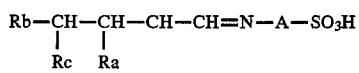

where Rb is hydrogen, a $C_1$–$C_4$ alkyl group or a phenyl group,

Ra is hydrogen or a $C_1$–$C_4$ alkyl group,

Rc is hydrogen or a hydroxyl group and

A is a phenylene group.

13. The electroplating solution as claimed in claim 12 wherein R is a $C_{10}$ alkyl group, x+x' is 8, y+y' is 3, Ra is a $C_2$ alkyl group, Rb is a $C_2$ alkyl and Rc is a hydroxyl group.

14. The electroplating solution as claimed in claim 13, wherein said electroplating solution has a composition which is selected from the group consisting of (a) 19 g/l of the lead methanesulfonate, 1 g/l of the tin methanesulfonate, 70 g/l of the methanesulfonic acid, 5 g/l of the polyoxyethylene polyoxypropylene amine and 5 g/l of the aldol sulfanilic acid compound;

(b) 38 g/l of the lead methanesulfonate, 2 g/l of the tin methanesulfonate, 70 g/l of the methanesulfonic acid, 6 g/l of the polyoxyethylene polyoxypropylene amine and 7 g/l of the aldol sulfanilic acid compound;

(c) 57 g/l of the lead methanesulfonate, 3 g/l of the tin methanesulfonate, 70 g/l of the methanesulfonic acid, 8 g/l of the polyoxyethylene polyoxypropylene amine and 10 g/l of the aldol sulfanilic acid compound;

(d) 237.5 g/l of the lead methanesulfonate, 12.5 g/l of the tin methanesulfonate, 200 g/l of the methanesulfonic acid, 20 g/l of the polyoxyethylene polyoxypropylene amine and 20 g/l of the aldol sulfanilic acid compound;

(e) 160 g/l of the lead methanesulfonate, 240 g/l of the tin methanesulfonate, 250 g/l of the methanesulfonic acid, 30 g/l of the polyoxyethylene polyoxypropylene amine and 20 g/l of the aldol sulfanilic acid compound;

(f) 19 g/l of the lead methanesulfonate, 1 g/l of the tin methanesulfonate, 20 g/l of the methanesulfonic acid, 5 g/l of the polyoxyethylene polyoxypropylene amine and 5 g/l of the aldol sulfanilic acid compound;

(g) 19 g/l of the lead methanesulfonate, 1 g/l of the tin methanesulfonate, 300 g/l of the methanesulfonic acid, 5 g/l of the polyoxyethylene polyoxypropylene amine and 5 g/l of the aldol sulfanilic acid compound;

(h) 19 g/l of the lead methanesulfonate, 1 g/l of the tin methanesulfonate, 100 g/l of the methanesulfonic acid, 1 g/l of the polyoxyethylene polyoxypropylene amine and 1 g/l of the aldol sulfanilic acid compound;

(i) 19 g/l of the lead methanesulfonate, 1 g/l of the tin methanesulfonate, 70 g/l of the methanesulfonic acid, 50 g/l of the polyoxyethylene polyoxypropylene amine and 1 g/l of the aldol sulfanilic acid compound;

(j) 38 g/l of the lead methanesulfonate, 2 g/l of the tin methanesulfonate, 70 g/l of the methanesulfonic acid, 6 g/l of the polyoxyethylene polyoxypropylene amine and 0.1 g/l of the aldol sulfanilic acid compound;

(k) 38 g/l of the lead methanesulfonate, 2 g/l of the tin methanesulfonate, 70 g/l of the methanesulfonic acid, 6 g/l of the polyoxyethylene polyoxypropylene amine and 30 g/l of the aldol sulfanilic acid compound;

(l) 2.4 g/l of the lead methanesulfonate, 0.6 g/l of the tin methanesulfonate, 50 g/l of the methanesulfonic acid, 5 g/l of the polyoxyethylene polyoxypropylene amine and 6 g/l of the aldol sulfanilic acid compound;

(m) 100 g/l of the lead methanesulfonate, 150 g/l of the tin methanesulfonate, 50 g/l of the methanesulfonic acid, 10 g/l of the polyoxyethylene polyoxypropylene amine and 15 g/l of the aldol sulfanilic acid compound; and (n) 120 g/l of the lead methanesulfonate, 80 g/l of the tin methanesulfonate, 150 g/l of the methanesulfonic acid, 10 g/l of the polyoxyethylene polyoxypropylene amine and 15 g/l of the aldol sulfanilic acid compound.

15. The electroplating solution as claimed in claim 9, wherein the aldol sulfanilic acid compound is of the formula

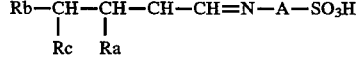

where Rb is hydrogen, a $C_1$–$C_4$ alkyl group or a phenyl group,

Ra is hydrogen or a $C_1$–$C_4$ alkyl group,

Rc is hydrogen or a hydroxyl group and

A is a phenylene group.

UNITED STATES PATENT AND TRADEMARK OFFICE
CERTIFICATE OF CORRECTION

PATENT NO. : 5,651,873
DATED : July 29, 1997
INVENTOR(S) : UCHIYAMA et al.

It is certified that error appears in the above-identified patent and that said Letters Patent is hereby corrected as shown below:

Column 11, line 52, Claim 1, insert --a-- in front of polyoxyethylene --.

Column 13, line 35, Claim 7, replace "y=y'" with --y+y'--;

lines 44, 52, 56, 61 and 66, Claim 8, replace "at" with --of--.

Column 14, lines 4, 8, 12, 17, 21, 25, 29, 33, 37 and 42, (Claim 8), replace "at" with --of--;

line 45, Claim 9, replace "water" with --wafer--;

line 46, Claim 9, after "an" insert --aqueous--.

Column 15, line 19, Claim 12, replace "claim 1" with --claim 11--.

Signed and Sealed this

Seventh Day of March, 2000

Attest:

*Attesting Officer*

Q. TODD DICKINSON

*Commissioner of Patents and Trademarks*